United States Patent
Park

(10) Patent No.: US 7,704,776 B2
(45) Date of Patent: Apr. 27, 2010

(54) METHOD OF FORMING A VERTICAL IMAGE SENSOR THAT INCLUDES PATTERNING AN OXIDE LAYER TO FORM A MASK FOR IMPLANTING A FLOATING DIFFUSION AREA

(75) Inventor: Jeong-Su Park, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 124 days.

(21) Appl. No.: 11/936,396

(22) Filed: Nov. 7, 2007

(65) Prior Publication Data

US 2008/0142857 A1 Jun. 19, 2008

(30) Foreign Application Priority Data

Dec. 15, 2006 (KR) .................. 10-2006-0128326

(51) Int. Cl.
*H01L 31/18* (2006.01)

(52) U.S. Cl. .................... 438/60; 438/74; 438/508; 257/E31.084; 257/E21.035

(58) Field of Classification Search .......... 257/E31.084, 257/E31.085
See application file for complete search history.

(56) References Cited

U.S. PATENT DOCUMENTS

| 7,419,844 | B2 * | 9/2008 | Lee et al. ............... 438/48 |
| 2006/0138494 | A1 * | 6/2006 | Lee .................... 257/292 |
| 2006/0138531 | A1 * | 6/2006 | Lee .................... 257/327 |
| 2008/0061329 | A1 * | 3/2008 | Park ................... 257/292 |
| 2008/0128847 | A1 * | 6/2008 | Woo ................... 257/440 |
| 2008/0157139 | A1 * | 7/2008 | Lee .................... 257/292 |

* cited by examiner

*Primary Examiner*—Stephen W Smoot
(74) *Attorney, Agent, or Firm*—Sherr & Vaughn, PLLC

(57) ABSTRACT

Embodiments relate to an image sensor and a method for manufacturing an image sensor that may prevent a photoresist pattern from remaining on gates by forming a floating diffusion area faster than the gates. According to embodiments, since the gates may not be influenced by an ion implantation process, current characteristics and operation reliability may be enhanced. According to embodiments, the method may include forming dummy ion implantation mask patterns for forming a floating diffusion area over an epitaxial layer and forming an ion implantation mask pattern over the epitaxial layer and at least a portion of the dummy ion implantation mask patterns, so as to form the floating diffusion area by performing an ion implantation process.

16 Claims, 4 Drawing Sheets

METHOD OF FORMING A VERTICAL IMAGE SENSOR THAT INCLUDES PATTERNING AN OXIDE LAYER TO FORM A MASK FOR IMPLANTING A FLOATING DIFFUSION AREA

BACKGROUND

The present application claims priority under 35 U.S.C. 119 and 35 U.S.C. 365 to Korean Patent Application No. 10-2006-0128326 (filed on Dec. 15, 2006), which is hereby incorporated by reference in its entirety.

An image sensor may be a semiconductor device that may convert optical images into electric signals. An image sensor may be classified into horizontal and vertical image sensors.

A horizontal image sensor may be operated in such a manner that transistors may be formed on a semiconductor substrate corresponding to the number of pixels through a CMOS technology. The transistors may be switched such that an output signal may be detected.

Further, in the horizontal image sensor, a color filter may be formed on a pixel array, and the color filter may transmit a specific wavelength of light to the transistors. However, since the color filter may require three pixels to detect red, green and blue colors, the required area of a pixel needed to realize one color may become broader.

In contrast, a vertical image sensor may include photodiodes having various colors, which may be vertically formed on a plurality of epitaxial layers. Accordingly, various colors may be realized using a single pixel.

Gates may be formed in an upper layer of the vertical image sensor, and a diffusion area may be formed between the gates. A photoresist pattern may be used to perform two functions, including defining the diffusion area and selectively isolating ions implanted into the diffusion area.

The photoresist pattern should preferably have a small thickness, less than or equal to a reference value, to precisely define the diffusion area. However, the photoresist pattern should preferably have a large thickness to selectively isolate ions implanted into the diffusion area.

Therefore, a gate may be first formed using a first photoresist pattern, and a second photoresist pattern may be formed on the gate, thereby selectively opening the diffusion area.

However, since the dual photoresist patterns may contain a large amount of ions, they may be easily cured in the subsequent process. Since it may be difficult to remove the dual photoresist patterns through the cleaning process, the electrical characteristic and operation reliability of a device may be degraded.

SUMMARY

Embodiments relate to an image sensor and a method of manufacturing an image sensor.

According to embodiments, a method for manufacturing an image sensor may include forming a photodiode structure including a plurality of photodiodes formed into a vertical structure, forming an upper epitaxial layer having trenches on the photodiode structure, forming an oxide layer on the upper epitaxial layer and forming dummy ion implantation mask patterns for forming a floating diffusion area by patterning the oxide layer, forming an ion implantation mask pattern formed on the upper epitaxial layer including the dummy ion implantation mask patterns and exposing the upper epitaxial layer at a portion in which the floating diffusion area may be formed, and forming the floating diffusion area by performing an ion implantation process.

DRAWINGS

DESCRIPTION

Figure 1:
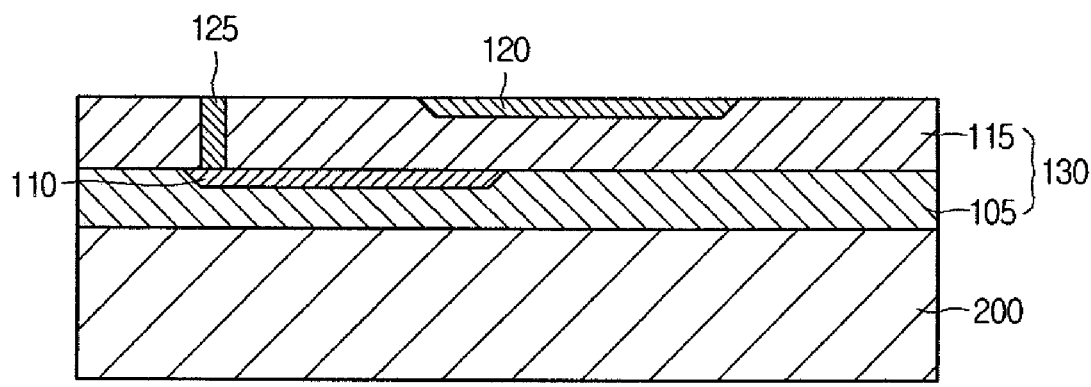
FIG. 1 is a side sectional drawing illustrating a configuration after a photodiode structure is formed on a semiconductor substrate, according to embodiments.

FIG. 1 is a side sectional view showing a configuration after a photodiode structure 130 is formed on semiconductor substrate 200, according to embodiments.

Referring to FIG. 1, photodiode structure 130 may be formed on semiconductor substrate 200. Photodiode structure 130 may include a plurality of photodiodes vertically arranged.

Figure 8:
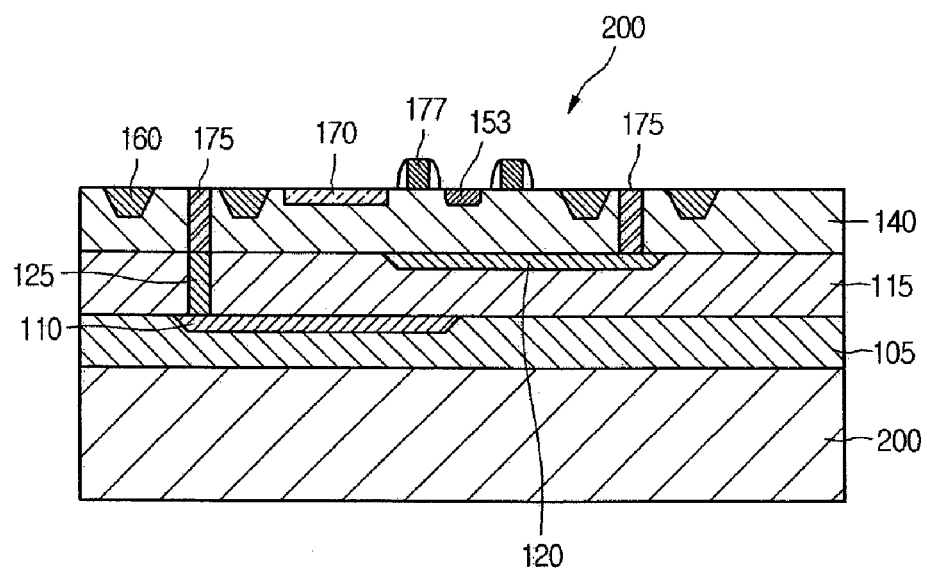
FIG. 8 is a side sectional drawing illustrating a configuration after a gate and a third photodiode are formed, according to embodiments.

The image sensor according to embodiments may include three photodiodes, i.e., first photodiode 110, second photodiode 120, and third photodiode 170 (See FIG. 8).

First, second, and third photodiodes 110, 120 and 170 may not be horizontally formed in one epitaxial layer, but may be vertically arranged in different epitaxial layers, i.e., lower epitaxial layer 105, middle epitaxial layer 115, and upper epitaxial layer 140 (See FIG. 8).

In embodiments, the image sensor may have the structure of a vertical image sensor.

Lower epitaxial layer 105 may be formed on semiconductor substrate 200, and a photoresist pattern (not shown) may be formed on lower epitaxial layer 105 and may define an area of first photodiode 110.

When performing an ion implantation process, ions may be implanted through an opening area of the photoresist pattern, and first photodiode 110 may be formed in a portion of lower epitaxial layer 105.

In embodiments, first photodiode 110 may be a red photodiode.

After forming first photodiode 110, the photoresist pattern may be removed, and middle epitaxial layer 115 may be formed on lower epitaxial layer 105.

A photoresist pattern (not shown) may then be formed on middle epitaxial layer 115, and may define an area of second photodiode 120.

When performing an ion implantation process, ions may be implanted through an opening area of the photoresist pattern, and second photodiode 120 may be formed in a portion of middle epitaxial layer 115. The photoresist pattern for forming second photodiode 120 may be removed.

In embodiments, second photodiode 120 may be a green photodiode.

Subsequently, as vertically projected from a top side, a photoresist pattern (not shown) may be formed such that a portion of middle epitaxial layer 115 corresponding to the area of first photodiode 110 may be exposed, and an ion implantation process may be performed.

Thus, ions may be implanted through an opening of the photoresist pattern, and lower plug 125, which may be electrically connected to first photodiode 110 beneath lower plug 125, may be formed in middle epitaxial layer 115. After that, the photoresist pattern used to form lower plug 125 may be removed.

In embodiments, photodiode structure 130 may thus be completed.

Figure 2:
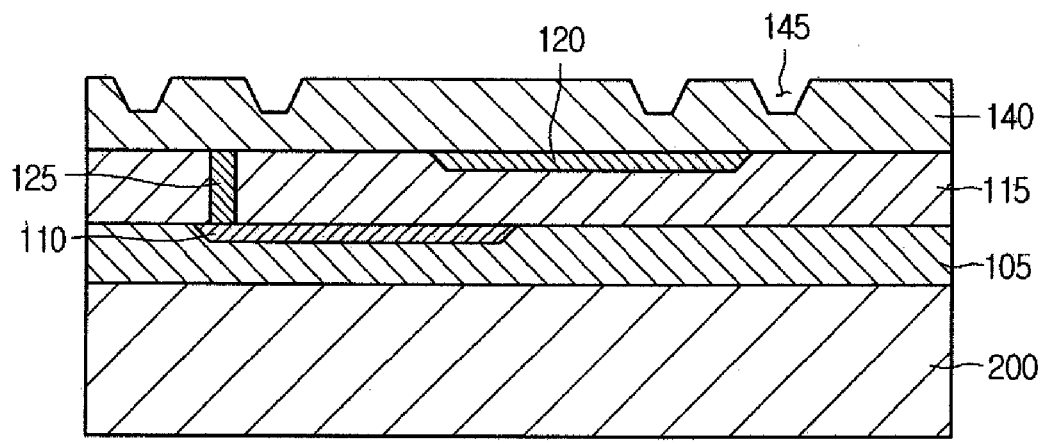
FIG. 2 is a side sectional drawing illustrating a configuration after an upper epitaxial layer is formed, according to embodiments.

FIG. 2 is a side sectional view showing a configuration after upper epitaxial layer 140 is formed, according to embodiments.

Referring to FIG. 2, upper epitaxial layer 140 may be grown on middle epitaxial layer 115, and a photoresist pattern (not shown) may be formed to have an opening at a portion in which isolation layers may be formed.

Trenches 145 may then be formed in upper epitaxial layer 140 at the portion in which the isolation layers may be formed, for example by performing an etching process using the photoresist pattern as an etching mask.

Figure 3:
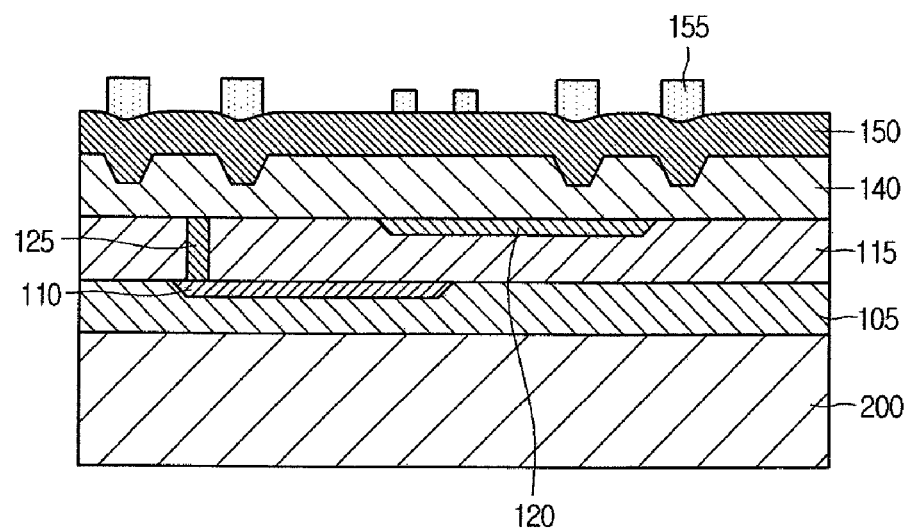
FIG. 3 is a side sectional drawing illustrating a configuration after an oxide layer is patterned, according to embodiments.

FIG. 3 is a side sectional view showing a configuration after oxide layer 150 is patterned, according to embodiments.

Referring to FIG. 3, oxide layer 150 may be formed on a surface, for example the entire surface, of upper epitaxial layer 140 while filling trenches 145.

Photoresist patterns 155 may then be formed on oxide layer 150.

Photoresist patterns 155 may be formed through a development and exposure process of a photoresist. In embodiments, photoresist patterns 155 may be formed at positions corresponding to trenches 145 and floating diffusion area 153 (See FIG. 8).

Figure 4:
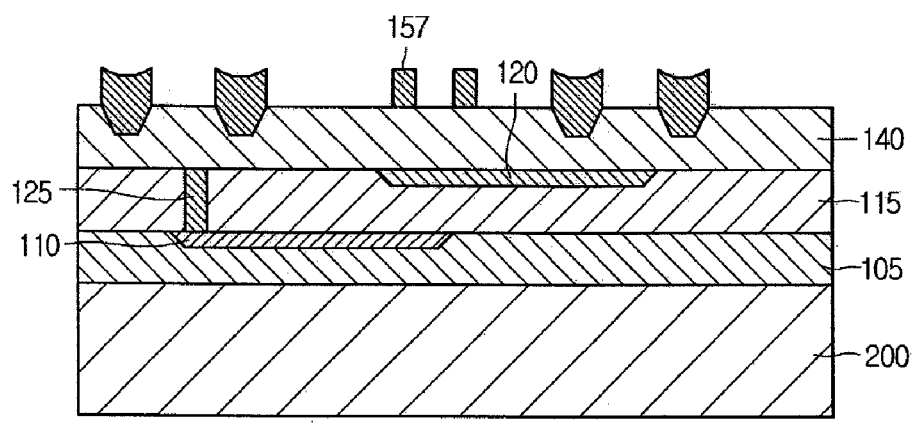
FIG. 4 is a side sectional drawing illustrating a configuration after the oxide layer is etched, according to embodiments.

FIG. 4 is a side sectional view showing a configuration after oxide layer 150 is etched, according to embodiments.

Referring to FIG. 4, oxide layer 150 may be patterned using photoresist patterns 155 as an etching mask.

Patterned oxide layer 150 may have a shape protruding upward from trenches 145 and floating diffusion area 153 (FIG. 8). Particularly, pattern portions formed at both sides of floating diffusion area 153 may serve as dummy ion implantation mask patterns 157.

Photoresist pattern 155 may be removed.

Figure 5:
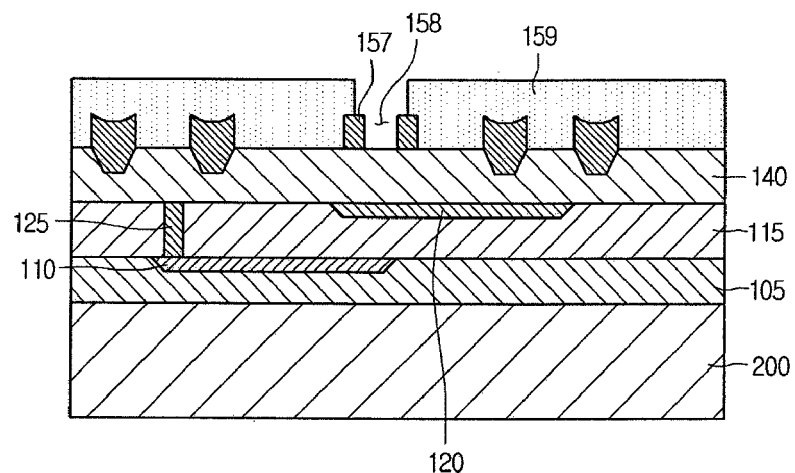
FIG. 5 is a side sectional drawing illustrating a configuration after an ion implantation mask pattern is formed, according to embodiments.

FIG. 5 is a side sectional view showing a configuration after ion implantation mask pattern 159 is formed, according to embodiments.

Referring to FIG. 5, ion implantation mask pattern 159 may be formed in an area of upper epitaxial layer 140 except for area 158 between dummy ion implantation mask patterns 157.

In embodiments, ion implantation mask pattern 159 may be formed to cover oxide layer 150 on the trench area, a portion of upper epitaxial layer 140, and a portion of dummy ion implantation mask patterns 157.

Area 158 between dummy ion implantation mask patterns 157 may be a portion in which floating diffusion area 153 (FIG. 8) may be formed, and the position of dummy ion implantation mask patterns 157 may be positions at which gates may be formed. For reference, dummy ion implantation mask patterns 157 may be removed in a subsequent process.

Dummy ion implantation mask pattern 157 may be an area for defining floating diffusion area 153 (FIG. 8), and ion implantation mask pattern 159 may be an area for blocking ions implanted to form floating diffusion area 153 (FIG. 8).

Thus, dummy ion implantation mask pattern 157 may be formed to have a sufficiently low height for the purpose of satisfying a precise interval of floating diffusion area 153, e.g., an interval of about 0.25 μm, according to embodiments.

For example, the dummy ion implantation mask pattern 157 may be formed to have a height of about 0.95 μm or less.

Ion implantation mask pattern 159 may be formed as sufficiently high as blocking may be performed in the ion implantation of floating diffusion area 153 (FIG. 8).

For example, ion implantation mask pattern 159 may be formed to have a height of about 1.25 μm or more.

Figure 6:
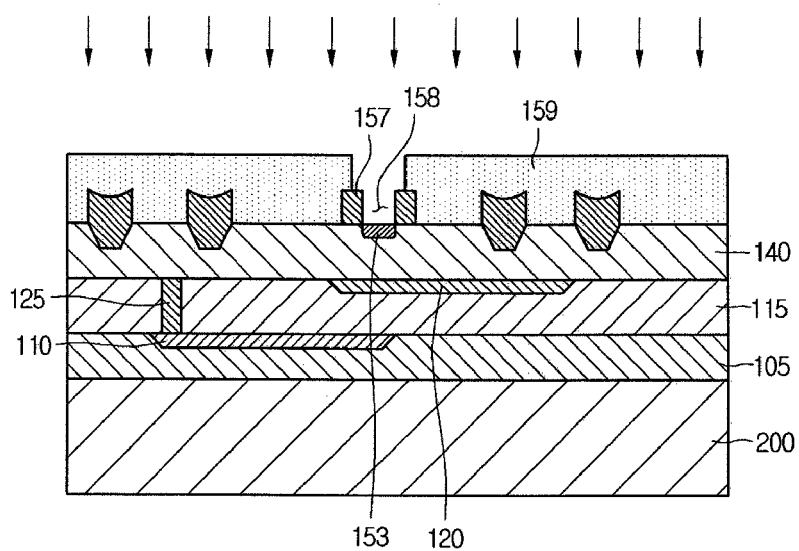
FIG. 6 is a side sectional drawing illustrating a configuration after a floating diffusion area is formed, according to embodiments.

FIG. 6 is a side sectional view showing a configuration after floating diffusion area 153 is formed, according to embodiments.

Referring to FIG. 6, ions may be implanted into upper epitaxial layer 140 using ion implantation mask pattern 159 and dummy ion implantation mask patterns 157 as an ion implantation mask. As ions are implanted into upper epitaxial layer 140, floating diffusion area 153 may be formed.

In embodiments, ion implantation energy for forming floating diffusion area 153 may be about 120 to 140 keV.

Figure 7:
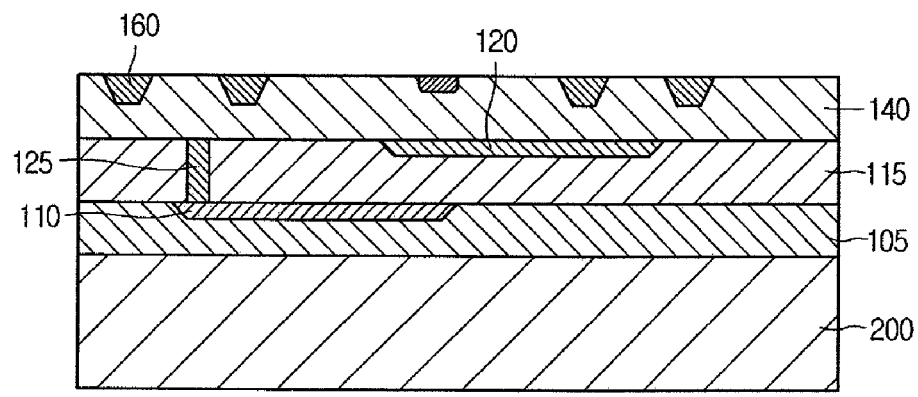
FIG. 7 is a side sectional drawing illustrating a configuration after dummy ion implantation mask patterns and the ion implantation mask pattern are removed, according to embodiments.

FIG. 7 is a side sectional view showing a configuration after dummy ion implantation mask patterns 157 and ion implantation mask pattern 159 are removed, according to embodiments.

Referring to FIG. 7, after forming floating diffusion area 153, dummy ion implantation mask patterns 157 and ion implantation mask pattern 159 may be removed from upper epitaxial layer 140 through a chemical mechanical polishing (CMP) process.

Isolation layers 160 may thus be finally formed in upper epitaxial layer 140.

FIG. 8 is a side sectional view showing a configuration after gate 177 and third photodiode 170 are formed, according to embodiments.

Referring to FIG. 8, after forming isolation layers 160, third photodiode 170 may be formed in upper epitaxial layer 140. In embodiments, third photodiode 170 may be a blue photodiode.

According to embodiments, third photodiode 170 may be formed through photoresist and ion implantation processes.

Subsequently, as vertically projected from a top side, a photoresist pattern (not shown) may be formed such that an area of upper epitaxial layer 140 corresponding to lower plug 125 and a portion of upper epitaxial layer 140 corresponding to the area of second photodiode 120 may be exposed, and an ion implantation process may be performed.

Ions may be implanted using the photoresist pattern as an ion implantation mask, and upper plugs 175 electrically connected to lower plug 125 and second photodiode 120 may be formed in upper epitaxial layer 140. After that, the photoresist pattern for forming the upper plugs 175 may be removed.

Transistor structures, including gates 177, may be formed in upper epitaxial layer 140 at both sides of floating diffusion area 153, thereby completing an image sensor.

It may be apparent to those skilled in the art that various modifications and variations may be made to embodiments. Thus, it is intended that embodiments cover modifications and variations thereof within the scope of the appended claims. It is also understood that when a layer is referred to as being "on" or "over" another layer or substrate, it may be directly on the other layer or substrate, or intervening layers may also be present.

What is claimed is:

1. A method, comprising:
   forming a photodiode structure including a plurality of photodiodes vertically aligned;
   forming an upper epitaxial layer over the photodiode structure;
   forming an oxide layer over the upper epitaxial layer and forming dummy ion implantation mask patterns for forming a floating diffusion area by patterning the oxide layer;
   forming an ion implantation mask pattern over the upper epitaxial layer including the dummy ion implantation mask patterns and exposing the upper epitaxial layer at a portion in which the floating diffusion area is to be formed; and
   forming the floating diffusion area by performing an ion implantation process.

2. The method of claim 1, further comprising removing the dummy ion implantation mask patterns and the ion implantation mask pattern.

3. The method of claim 2, wherein the dummy ion implantation mask patterns and the ion implantation mask pattern are removed through a chemical mechanical polishing process when removing the dummy ion implantation mask patterns and the ion implantation mask pattern.

4. The method of claim 1, wherein the plurality of photodiodes are vertically arranged in the upper epitaxial layer.

5. The method of claim 1, wherein forming the upper epitaxial layer comprises forming trenches in the upper epitaxial layer.

6. The method of claim 5, wherein the trenches are buried in the oxide layer when forming the dummy ion implantation mask patterns, and forming the dummy ion implantation mask patterns comprises forming isolation layers in the trenches by removing the dummy ion implantation mask patterns and the ion implantation mask pattern.

7. The method of claim 1, wherein the ion implantation mask pattern is formed up to a portion of a top surface of the dummy ion implantation mask patterns, exposing the upper epitaxial layer at a portion in which the floating diffusion area is to be formed when forming the dummy ion implantation mask patterns.

8. The method of claim 1, wherein forming the photodiode structure comprises:
   forming a lower epitaxial layer over the semiconductor substrate and forming a first photodiode over the lower epitaxial layer; and
   forming a middle epitaxial layer over the lower epitaxial layer and forming a second photodiode over the middle epitaxial layer.

9. The method of claim 8, further comprising forming a lower plug coupled to the first photodiode in the middle epitaxial layer.

10. The method of claim 9, wherein the lower plug is formed through a photoresist and ion implantation processes.

11. The method of claim 8, wherein the first and second photodiodes are formed through photoresist and ion implantation processes.

12. The method of claim 8, further comprising:
    forming a third photodiode over the upper epitaxial layer;
    forming upper plugs connected to the photodiodes of the photodiode structure in the upper epitaxial layer; and
    forming transistor structures over the upper epitaxial layer at both sides of the floating diffusion area.

13. The method of claim 12, wherein the first photodiode comprises a red photodiode and the second photodiode comprises a green photodiode.

14. The method of claim 12, wherein the third photodiode comprises a blue photodiode.

15. The method of claim 1, wherein forming the dummy ion implantation mask patterns comprises:
    forming a photoresist pattern at both sides of the floating diffusion area over the oxide layer;
    forming the dummy ion implantation mask patterns at both sides of the floating diffusion area by etching the oxide layer using the photoresist pattern as a mask; and
    removing the photoresist pattern.

16. The method of claim 1, wherein an ion implantation energy used in the ion implantation process is 120 to 140 keV when forming the floating diffusion area.

* * * * *